July 19, 1966 H. WEINSTEIN 3,261,989

FOUR-LAYER SEMICONDUCTOR DEVICE STRAIN SWITCH

Filed Jan. 17, 1964

INVENTOR.
HAROLD WEINSTEIN

BY

OSTROLENK, FABER, GERB & SOFFEN

ATTORNEYS

United States Patent Office 3,261,989

Patented July 19, 1966

3,261,989

FOUR-LAYER SEMICONDUCTOR DEVICE STRAIN SWITCH

Harold Weinstein, Van Nuys, Calif., assignor to International Rectifier Corporation, El Segundo, Calif., a corporation of California

Filed Jan. 17, 1964, Ser. No. 338,470

4 Claims. (Cl. 307—88.5)

This invention relates to a strain-sensitive device, and more specifically relates to a four-layer semi-conductor device which is switched to a current carrying condition responsive to the application thereof of a strain which exceeds some predetermined value.

Controlled rectifiers are well known to those skilled in the art, and are formed of four-layers of semiconductor material of alternate conductivity types. Such devices are commonly placed in a conduction condition by the application of a suitable current injected into the gate electrode.

I have recognized that the reverse leakage current at the gate electrode, when reverse biased, will substantially increase when a strain is applied to the gate junction whereby this phenomena can be used for a switching device which is responsive to the application of a strain to this junction.

In accordance with the present invention, a controlled rectifier-type device is formed which preferably has a relatively small cathode area and large gate area wherein strain applying means can be connected to the junction associated with the gate region. Some predetermined reverse bias is then applied to this junction which is normally insufficient to cause conduction of the controlled rectifier.

When, however, strain is applied to the junction, its reverse leakage current will be increased to a point at which the device is fired, whereupon the device becomes conductive responsive to the application of a strain which exceeds some predetermined value.

While these strains could generally be applied over the whole semiconductor wafer, I have found that compression strains do not cause sufficient change in reverse current to be easily used for the switching purpose of the present invention. Thus, while compression strain is not removed from the concept of the invention, best results will be obtained by applying bending strain to the wafer.

Accordingly, a primary object of this invention is to provide a novel strain-responsive switch.

Another object of this invention is to utilize the characteristics of four-layer semiconductor devices for the measurement of strain.

Yet another object of this invention is to effect the firing bias level of a controlled rectifier by applying strain to the unit.

These and other objects of my novel invention will become apparent from the following description when taken in connection with the drawings, in which.

Figure 1:
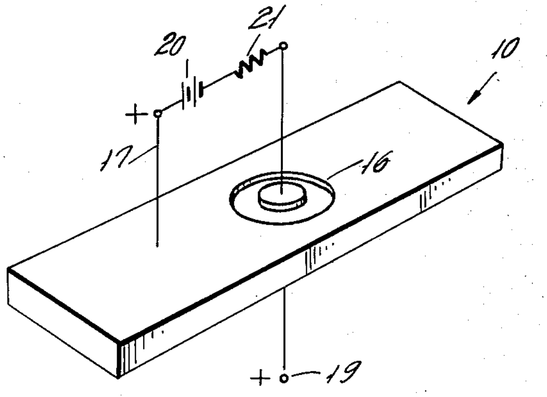
FIGURE 1 shows a perspective drawing of a four-layer device constructed in accordance with the present invention.
Figure 2:
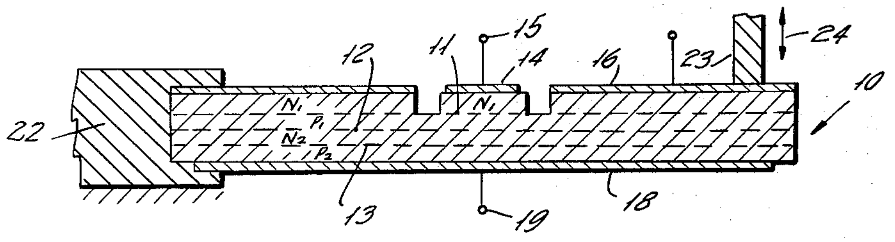
FIGURE 2 is a cross-sectional view of the device of FIGURE 1 and further illustrates the physical mounting of the device and means for applying strains thereto.

Referring first to FIGURES 1 and 2, I have illustrated therein a controlled rectifier type device which is formed of a rectangular block or wafer 10 of some suitable semiconductor material such as silicon. The wafer or block 10 is suitably processed according to well-known techniques to have four layers of alternate conductivity types formed therein such as the layers $N_1$, $P_1$, $N_2$ and $P_2$ which are separated by junctions 11, 12 and 13. The letters N and P, of course, refer to the conductivity type of the particular regions.

A suitable electrode 14 is then plated on the upper $N_1$ region and receives an emitter terminal 15, while a similar suitable electrode 16 is formed on the upper $P_1$ region to receive the gate terminal 17. Note that whereas the area of the gate structure is normally relatively small compared to the area of the emitter structure, in the present application this is preferably reversed with the emitter having a relatively small area and the gate having a relatively large area. A suitable electrode 18 is then formed on the lower $P_2$ region to receive the anode electrode 19.

The principle of the present invention is to control the leakage across junction 11, which is reverse biased, by means of a strain which is applied to the unit. To this end, a reverse bias is connected, as illustrated in FIGURE 1, wherein a suitable D.-C. source 20 is connected to a current limiting resistor 21 and to the terminals 15 and 17 with the polarity of battery 20 being such as to reverse bias the junction 11.

The complete unit is then appropriately supported, as illustrated in FIGURE 2, at its left-hand end by means of a suitable mounting clamp 22. A movable body 23 is then positioned at the opposite end of the device and is capable of moving toward and away from the body 10, as indicated by the double-ended arrow 24.

In accordance with the invention, the reverse bias applied to junction 11 is of a magnitude which normally (in the absence of strain) is insufficient to cause conduction between the main electrodes 19 and 15.

When, however, a strain which exceeds some predetermined magnitude is applied to the device by means of the movable member 23, the reverse bias current through junction 11 increases sufficiently to permit conduction or firing of the device so that current flow occurs from terminals 19 to 15.

Figure 3:
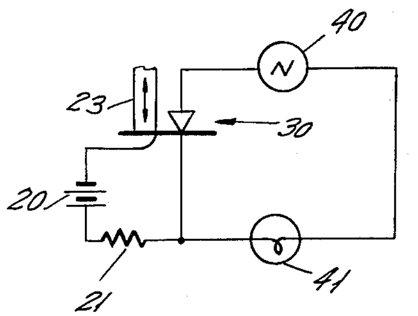
FIGURE 3 is an electrical circuit diagram illustrating one manner in which the strain-measuring device can be used in an electrical circuit.

The manner in which this novel device may be applied is illustrated in FIGURE 3 wherein the device is schematically illustrated by the conventional circuit diagram for the controlled rectifier 30. A gate bias voltage 20 is then applied in the appropriate manner in series with current limiting resistor 21, while the anode and cathode of the device are connected in series with a suitable A.-C. voltage source 40 and a series connected load such as a lamp 41.

The strain which is to be measured by the device is shown in FIGURE 3 as member 23 which can apply strain to the device 30. Thus, the circuit can measure when the strain applied by source 23 exceeds some predetermined magnitude in that the device 30 will be fired on each half cycle of source 40 so that the lamp 41 will be energized each half cycle to deliver a steady glow. Once the strain is removed, or falls beneath that magnitude required to fire the device, the lamp 41 will be extinguished. Thus, the lamp 41 can serve as an appropriate indicator that some predetermined mechanical condition exists. Clearly, any other suitable type load can be used in place of the lamp 41.

Although this invention has been described with respect to its preferred embodiments, it should be understood that many variations and modifications will now be obvious to those skilled in the art, and it is preferred therefore that the scope of the invention be limited not by the specific disclosure herein, but only by the appended claims.

The embodiments of the invention in which an exclusive privilege or property is claimed are defined as follows:

1. A strain switch comprising a wafer of semiconductor material having four layers of alternate conductivity types forming three junctions; the upper layer of said four layers being divided into a first and second portion; said first and second portions having a first main electrode and a gate electrode respectively connected thereto; the bottom layer of said four layers having a second main electrode connected thereto, and bias circuit means connected between said first main electrode and said gate electrode for reverse biasing the junction formed between said second portion of said upper layer and the layer of said four layers adjacent said upper layer.

2. A strain switch comprising a wafer of semiconductor material having four layers of alternate conductivity types forming three junctions; the upper layer of said four layers being divided into a first and second portion; said first and second portions having a first main electrode and a gate electrode respectively connected thereto; the bottom layer of said four layers having a second main electrode connected thereto, and bias circuit means connected between said first main electrode and said gate electrode for reverse biasing the junction formed between said second portion of said upper layer and the layer of said four layers adjacent said upper layer; and means for applying a mechanical strain to said last mentioned junction; said bias being normally insufficient to cause conduction between said first and second main electrodes, said device being fired responsive to the application of a predetermined strain to said device.

3. The device substantially as set forth in claim 1 wherein the area of said second portion is greater than the area of said first portion.

4. The device substantially as set forth in claim 2 wherein said means for applying a mechanical strain is connected to one end of said device to apply a bending force to said device.

No references cited.

ARTHUR GAUSS, *Primary Examiner.*

D. D. FORRER, *Assistant Examiner.*